United States Patent [19]

Sato et al.

[11] Patent Number: 4,835,272

[45] Date of Patent: May 30, 1989

[54] PROCESS FOR FORMATION OF BASE AND LIGHT-SENSITIVE MATERIAL

[75] Inventors: Kozo Sato; Shunichi Ishikawa; Ken Kawata, all of Kanagawa, Japan

[73] Assignee: Fuji Photo Film Co., Ltd., Kanagawa, Japan

[21] Appl. No.: 74,120

[22] Filed: Jul. 16, 1987

[30] Foreign Application Priority Data

Jul. 16, 1986 [JP] Japan ................................ 61-167558
Jul. 16, 1986 [JP] Japan ................................ 61-167559

[51] Int. Cl.$^4$ ............................................ C07D 265/30
[52] U.S. Cl. ................................ 544/158; 260/665 R; 546/181; 546/290; 546/350; 548/136; 548/152; 548/165; 548/202; 548/445; 548/480; 549/50; 549/506; 560/104; 564/90; 564/218; 564/305; 568/579; 568/616; 568/632; 568/657; 568/927; 585/422; 585/505
[58] Field of Search ............... 260/665 R; 585/422, 585/505; 544/158; 546/181, 290, 350; 548/136, 152, 165, 202, 445, 480; 549/80, 506; 560/104; 564/90, 218, 305; 568/579, 616, 652, 657, 927

[56] References Cited

PUBLICATIONS

Pauson, Organometallic Chemistry, St. Martin's Press, New York (1967) pp. 25 and 26.

Zeiss, Organometallic Chemistry, Rheinhold, New York (1960) pp. 458–463.

*Primary Examiner*—Richard L. Raymond
*Attorney, Agent, or Firm*—Sughrue, Mion, Zinn Macpeak & Seas

[57] ABSTRACT

A process for formation of a base, which comprises reacting an acetylide compound with a salt. The acetylide compound has the following formula:

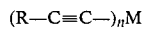

$$(R-C \equiv C-)_n M$$

wherein R is a monovalent group selected from the group consisting of an alkyl group, a cycloalkyl group, an alkenyl group, an alkynyl group, an aralkyl group, an aryl group and a heterocyclic group, each of which may have one or more substituent groups; M is an n-valent transition metal atom; and n is 1, 2 or 3. The salt is composed of an anion having an affinity for the transition metal (M) (the affinity of the anion for the transition metal is more than that of the acetylide anion (R—C≡C⊖)), and a cation derived from one selected from the group consisting of an alkali metal, an alkaline earth metal, ammonia and an organic base. A light-sensitive material containing the acetylide compound and the salt is also disclosed.

7 Claims, 1 Drawing Sheet

F I G. 1
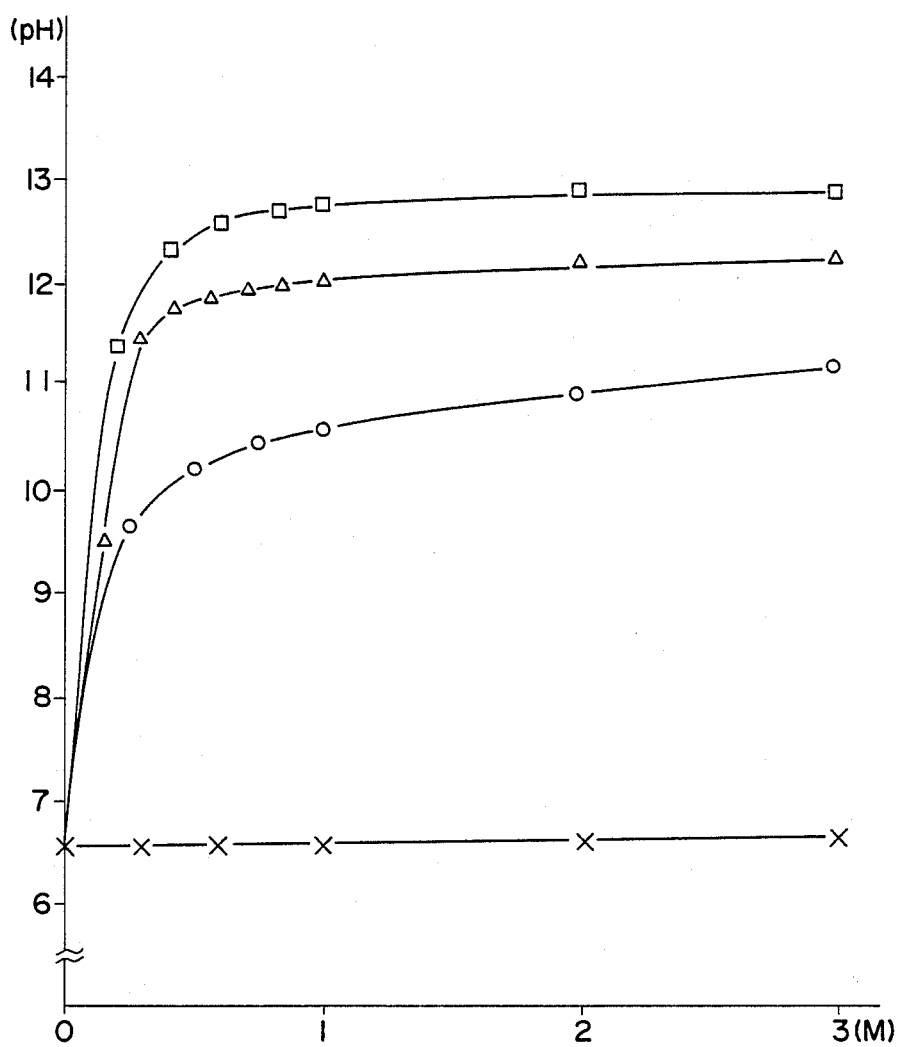

PROCESS FOR FORMATION OF BASE AND LIGHT-SENSITIVE MATERIAL

BACKGROUND OF THE INVENTION

1. Field of the Invention

The present invention relates to a process for formation of a base, and more particularly to a process for formation of a base from compounds which are substantially neutral during the storage. The present invention also relates to a light-sensitive material comprising a light-sensitive layer containing silver halide, reducing agent and polymerizable compound provided on a support.

2. Description of Prior Arts

Bases are general-purpose reagents widely used in various reactions (e.g., hydrolysis, polymerization, coloration, redox reaction, and neutralization). Base component has been incorporated into many products such as developing solutions in silver salt photographic process, adhesives, detergents, etc.

However, the bases (particularly strong bases) have a problem with respect to the stability in that they absorb carbon dioxide in air and are then inactivated. Further, the strong bases, which are highly reactive, have much difficulty in storing them in contact with other component. Furthermore, there is a possibility that the bases have a harmful influence on the human body, for example, they irritate the skin. Therefore, when bases are handled, it is necessary to pay attention to the toxicity and the skin irritation.

Accordingly, the products containing a base component have problems in the stability of the bases, the preservability of other component in contact with the base and the handling characteristics.

SUMMARY OF THE INVENTION

The present inventors have studied a process for formation of a base from compounds which are substantially neutral during storage to improve the stability and the handling characteristics of products containing a base component.

It is an object of the present invention to provide a process for formation of an acetylide anion, which is a strong base, from neutral compounds which are stable and safe.

It is another object of the invention to provide a process for formation of a base from the acetylide anion.

There is provided by the present invention a process for formation of a base, which comprises reacting an acetylide compound having the following formula:

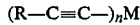

wherein

R is a monovalent group selected from the group consisting of an alkyl group, a cycloalkyl group, an alkenyl group, an alkynyl group, an aralkyl group, an aryl group and a heterocyclic group, each of which may have one or more substituent groups; M is an n-valent transition metal atom; and n is 1, 2 or 3;

with a salt composed of an anion having an affinity for the transition metal (M), said affinity of the anion for the transition metal being more than that of the acetylide anion $(R-C\equiv C^{\ominus})$, and a cation of one selected from the group consisting of an alkali metal, an alkaline earth metal, ammonia and an organic base.

The acetylide anion $(R-C\equiv C^{\ominus})$ formed according to the present invention can be used for various organic reactions, or the acetylide anion per se can be used as a base. The acetylide anion can be more advantageously utilized for the formation of various other bases.

Accordingly, there is also provided by the present intention a process for formation of a base, which comprises:

reacting the above-mentioned acetylide compound with a salt composed of an anion having affinity with the transition metal (M), said affinity of the anion for the transition metal being more than that of the acetylide anion $(R-C\equiv C^{\ominus})$, and a cation derived from one selected from the group consisting of an alkali metal, an alkaline earth metal, ammonia and an organic base; and reacting the resulting salt composed of the acetylide anion and the cation with a hydrogen doner.

The acetylide compound used for the process of the present invention, which has the above-mentioned formula, is substantially neutral and only slightly soluble in water so that they are highly stable and safe. Further, the strong base (i.e., acetylide anion) can be easily formed by reacting the acetylide compound with the above-mentioned salt according to the process of the present invention. Thus, the process of the invention has excellent advantages in that a stable starting compound, a simple reaction and a strong resulting base are involved.

Further, the process of the present invention can give various bases using a hydrogen doner (compound having an active hydrogen) and the acetylide anion which has been derived from the acetylide compound as mentioned above. Thus, the process of the invention has another advantage in that it is possible to give a base which is most suitable for a reaction system, in addition to the above-mentioned advantages.

BRIEF DESCRIPTION OF THE DRAWINGS

FIG. 1 is a graph illustrating pH change in an aqueous solution of the acetylide compound when potassium halides are added to the solution.

DETAILED DESCRIPTION OF THE INVENTION

The acetylide compound used in the present invention has the following formula.

In the process of the present invention, the acetylene linkage $(-C\equiv C-)$ of the acetylide compound participates in the base forming reaction. Thus, the base forming reaction in the invention can proceed without specific limitation with respect to the "R" and "M", so long as they are included in the definition given below.

In the formula, "R" is a monovalent group selected from the group consisting of an alkyl group, a cycloalkyl group, an alkenyl group, an alkynyl group, an aralkyl group, an aryl group and a heterocyclic group, each of which may have one or more substituent groups.

Examples of the alkyl group include butyl, isobutyl, cyclohexyl, heptyl, octyl and dodecyl. The alkyl group may be in the form of a straight chain of a branched chain. Examples of the substituent group which may be attached to the alkyl group include an alkoxy group (e.g., methoxy, hydroxyl, cyano, a halogen atom and a sulfoneamide group.

Examples of the cycloalkyl group include cyclopentyl, cyclohexyl, decahydronaphthyl and 1-hydroxy-1-cyclohexyl.

Examples of the alkenyl group include propenyl isopropenyl and styryl.

Examples of the alkynyl group include ethynyl and phenylethynyl.

Examples of the aryl group include phenyl and naphthyl.

Examples of the aralkyl group include benzyl and phenethyl.

The heterocyclic group preferably is a five-membered or six-membered ring containing nitrogen, oxygen or sulfur as a hetero atom. The heterocyclic ring may be a monocyclic ring or a condensed ring. Examples of the heterocyclic group include a residue of furan ring, a residue of thiophene ring, a residue of pyridine ring, a residue of quinoline ring, a residue of thiazole ring and a residue of benzothiazole ring.

Examples of the substituent group which may be attached to the aryl group, the aralkyl group or the heterocyclic group include an alkyl group (e.g., methyl, dodecyl), cyano, nitro, amino, an acylamino group, a sulfoanmide group (including aliphatic groups, aromatic groups and heterocyclic groups), an alkoxy group, an aryloxy group, an alkoxycarbonyl group, an ureido group, carbamoyl, an acyloxy group, a heterocyclic group (a five-membered or six-membered ring is preferred, and a nitrogen-containing ring is particularly preferred), an alkylsulfonyl group, carboxyl, sulfo, sulfamoyl and a halogen atom (fluorine, bromine, chlorine and iodine).

These substituent groups may be further substituted with other group. Two or more substituent groups may be attached to the "R" in the formula.

Among the groups which can constitute the "R", phenyl and a substituted phenyl group are particularly preferred.

In the formula, "M" is an n-valent transition metal atom and "n" is 1, 2 or 3.

In the formula, the "n" preferably is 1. Among the transition metal atoms (M), silver, copper (cuprous) and mercury (mercurous) are preferred and silver is particularly preferred.

Examples of the acetilide compound which are preferably used in the invention are described hereinafter.

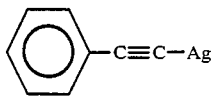

(1)

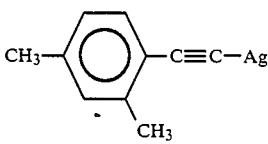

(2)

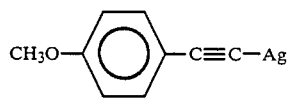

(3)

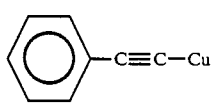

(4)

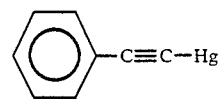

(5)

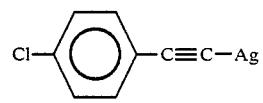

(6)

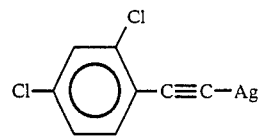

(7)

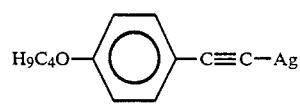

(8)

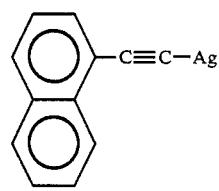

(9)

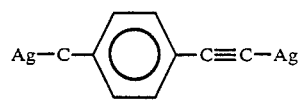

(10)

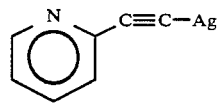

(11)

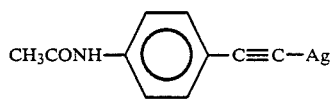

(12)

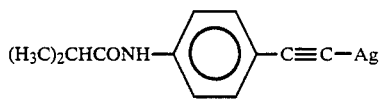

(13)

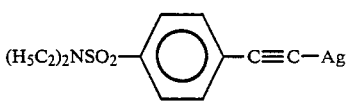

(14)

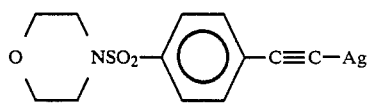

(15)

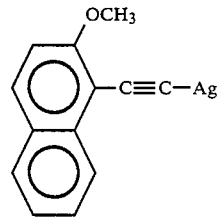

(16)

-continued

(17) [structure: 1-phenoxymethyl-2-(C≡C-Ag) naphthalene]

(18) [structure: anthracene with C≡C-Ag]

(19) PhCH₂—C≡C—Ag

(20) H₁₇C₈—C≡C—Ag

(21) H₃₃C₁₆—C≡C—Ag

(22) [structure: 1-ethynyl-silver-1-hydroxycyclohexane]

(23) [structure: PhO—CH₂—C≡C—Ag]

(24) [structure: naphthyl-OCH₂—C≡C—Ag]

(25) H₅C₂O—C₂H₄O—C₂H₄O—C₂H₄O—CH₂≡C—Ag

(26) [structure: benzothiazol-2-yl-SCH₂—C≡C—Ag]

(27) [structure: pyridin-2-yl-SCH₂—C≡C—Ag]

(28) Ag—C≡C—CH₂S—[thiadiazole]—SCH₂—C≡C—Ag

(29) [structure: 5-chloro-thiophen-2-yl C≡C—Ag]

-continued

(30) [structure: indole derivative with C≡C—Ag, N-CH₃, 2-CH₃]

(31) [structure: N-methylcarbazole with C≡C—Ag]

(32) [structure: quinolin-3-yl C≡C—Ag]

(33) [structure: quinolin-2-yl C≡C—Ag]

(34) [structure: biphenyl-C≡C—Ag]

(35) [structure: (H₅C₂)(H₉C₄)CHCONH—C₆H₄—C≡C—Ag]

(36) H₁₅C₇CONH—C₆H₄—C≡C—Cu

(37) H₃₅C₁₇CONH—C₆H₄—C≡C—Cu

(38) [structure: CH₃CONH, CH₃O substituted phenyl—C≡C—Ag]

(39) (C₂H₅)₂N—CONH—C₆H₄—C≡C—Ag

(40) [structure: phthalimido-N—CH₂—C≡C—Ag]

The acetylide compound used in the present invention can be generally prepared in the following manner.

In the most general process for the preparation of the acetylide compound, an acetylene compound (R—C≡CH) corresponding to the acetylide compound is dissolved in an organic solvent (e.g., methanol, ethanol or acetone) and an aqueous solution of a water-soluble salt of a transition metal (e.g., silver nitrate, silver acetate or copper acetate) is dropwise added to the solution of the acetylene compound while stirring. Most of the acetylide compounds used in the present invention are substantially insoluble in water. Thus, the slightly soluble acetylides can be easily obtained in the above-mentioned process. Where the reaction is carried out in an aqueous solvent containing a water-soluble binder (e.g., gelatin), a homogeneous fine dispersion of the acetylide can be easily obtained. Further, a process comprising reacting a salt of an acetylenecarboxylic acid corresponding to the acetylide compound with a metal salt is also available. This process has an advantage in that the organic solvent can be omitted. The reaction of this process can be more advantageously carried out in the presence of the water-soluble binder.

A Synthesis Example of a acetylide compound is described hareinafter. The other acetylide compounds can be prepared in a similar manner as in the Synthesis Example.

SYNTHESIS EXAMPLE 1

Synthesis of Silver Phenylacetylide (1)

In 500 ml of methanol was dissolved 29.2 g (0.2 mol) of phenylpropiolic acid. To the resulting solution while cooling the solution with water was dropwise added a solution of 34 g of silver nitrate in 100 ml of water at room temperature.

After the addition, the mixture was stirred at room temperature in the absence of light for one hour to obtain 37.5 g of silver phenylacetylide as white crystals (which must be stored in a dark place). The obtained silver acetylide is dispersed using a mixer and then used in the present invention.

The anion having an affinity for a transition metal of the acetylide, said affinity of the anion for the transition metal being more than that of the acetylide anion, is described below.

The anion is determined according to the transition metal of the acetylide compound. Examples of the anion which has a strong affinity for the transition metal and can be generally used are chlorine ion, bromine ion and iodine ion.

The anion of an organic acid can be also used as the above-mentioned anion. Examples of the organic acid include dithiocarbamic acid and its derivatives (e.g., diethyldithiocarbamic acid), xanthic acid and its derivatives (e.g., ethylxanthic acid), thiocyanic acid, mercaptoazoles (e.g., 2-mercapto-1-phenyltetrazole), tetrazaindenes, nitro-substituted aromatic compounds and nitro-substituted heterocyclic compounds. Concrete examples of the nitro-substituted heterocyclic compounds include triazoles (e.g., 5-nitrobenzotriazole), imidazoles (e.g., 5-nitro-2-methylbenzimidazole) and indazoles (e.g., 5-nitroindazole).

The cation which constitutes the salt with the anion is described below.

The cation is derived from one selected from the group consisting of an alkali metal, an alkaline earth metal, ammonia and an organic base. Where a hydrogen donor is reacted with a resulting salt of the acetylide anion and the cation to form a base, the cation is determined according to the kind of the base to be formed.

Examples of an inorganic ion among the above-mentioned cations include sodium ion, potassium ion, lithium ion, calcium ion, magnesium ion and ammonium ion.

Examples of the organic bases from which the cation can be derived, include amines (any of primary amines, secondary amines and tertiary amines can be used; e.g., dimethylamine), amidines, guanidines and nitrogen-containing heterocyclic compounds (e.g., piperidine, morpholine, piperazine, diazabicyclooctane, diazabicycloundecene, 2-methylimidazoline and 4-dimethylaminopyridine. Further, quaternary ammonium ions such as tetramethylammonium, tetraethylammonium, tetrabutylammonium, triethylbenzylammonium and cetyltriethylammonium ions can be also used as the cation.

The combination of the anion and the cation in the salt can be determined according to the purpose, use, etc. The salt may be an acid salt containing hydrogen atom (hydrogen salt). Thus, the term "salt composed of a cation and an anion" in the present invention includes the acid salt.

Examples of the salt composed of an inorganic cation and an inorganic anion include NaCl, NaBr, NaI, KCl, KBr, KI, LiCl, CaCl$_2$, MgCl$_2$, MgBr$_2$, BaCl$_2$, NH$_4$Cl, NH$_4$Br and NH$_4$I.

Examples of the salt composed of an organic cation and an inorganic anion include guanidine hydrochloride, guanidine hydrobromide, guanidine hydroiodide, dimethylamine hydrochloride, piperidine hydrobromide, morpholine hydrobromide, piperazine hydroiodide, diazabicyclooctane hydrobromide, diazabicycloundecene hydrobromide, 2-methylimidazoline hydrobromide, 4-dimethylaminopyridine hydrobromide, tetramethylammonium bromide, tetraethylammonium iodide, tetrabutylammonium bromide, triethylbenzylammonium chloride and cetyltriethylammonium chloride. Ammonium salt polymers which have an ammonium halide on side chain can be also used as the salt (ammonium salt may be any of primary, secondary, tertiary and quaternary salt).

Examples of the salt composed of an inorganic cation and an organic anion include sodium diethyldithiocarbamate, potassium ethylxanthate, potassium thiocyanate, sodium salt of 2-mercapto-1-phenyltetrazole, sodium salt of 5-nitrobenzotriazole, sodium salt of tetraazaindene, sodium salt of 5-nitro-2-methyl-benzimidazole and sodium salt of 5-nitroindazole.

In the present invention, the acetylide compound is reacted with the above-mentioned salt composed of an anion and a cation to form a base. The reaction can be represented by the following formula which shows the case where the valence of each of the transition metal (M), the anion (X$^\ominus$) and the cation (M'$^\oplus$) is 1 (the same is applied to the subsequent reaction formulas).

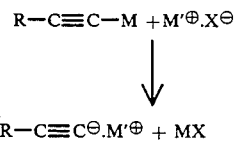

This reaction can be accelerated, when the reaction is carried out in a polar solvent such as water. However, in the case where the acceleration of the reaction is not required, for example, when the base is applied to adhesive, detergent, etc., the reaction can be carried out in a nonpolar solvent or in the absence of a solvent. Further the reaction can be also accelerated under a heating condition (preferably at a temperature of not lower than 30° C., and more preferably at a temperature of 80° to 200° C.).

The acetylide anion formed by the reaction of the invention can be applied to various organic reactions in addition to the formation of bases. For example, the acetylide anion can be used for various ethynylation reactions in place of Grignard reagent (R—C≡CMgX) derived from an acetylene compound. Where the acetylide anion of the present invention is used for the ethynylation reaction, the reaction can be carried out in a similar manner as in Grignard reaction. Even if the process of the present invention is used for other purpose than the formation of the base, the process has the aforementioned advantages of a stable starting compound, a simple reaction and a strong resulting base.

The acetylide anion is a very strong base so that the acetylide anion per se can be used as a base. Where the base is used as a catalyst for the polymerization reaction of anionic polymerizable monomers, the acetylide anion can be advantageously used as the base.

According to the present invention, various bases can be formed by reacting the resulting salt (R—C≡C⊖.M'⊕ in the above-mentioned formula) composed of the acetylide anion and the cation with a hydrogen donor (compound having an active hydrogen).

There is no specific limitation with respect to the hydrogen donor. An active hydrogen-containing compound having a pKa of not higher than 18 is preferred. Water, an alcohol and a phenol are particularly preferred.

Where water is used as the hydrogen donor, the reaction of the salt composed of an acetylide anion and a cation with water can be represented by the following reaction formula.

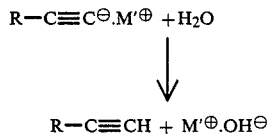

In this way, various hydroxides such as hydroxides of an alkali metal, an alkaline each metal, primary to quaternary ammoniums and an organic base can be formed as the base.

Where an alcohol or a phenol (R'OH) is used as the hydrogen donor, the reaction can be represented by the following reaction formula.

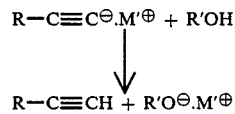

In this way, an alkoxide or a phenoxide (particularly, a metal alkoxide or a metal phenoxide) can be formed as the base.

The aforementioned reaction for forming the acetylide anion and the reaction with the hydrogen donor may be carried out separately or simultaneously. Where the pre-stage reaction is carried out in an aqueous solvent, the reaction with the hydrogen donor (i.e., water) automatically takes place successively.

As an example, the reaction of silver phenylacetylide (1) with potassiun bromide in an aqueous solvent is represented by the following reaction formula.

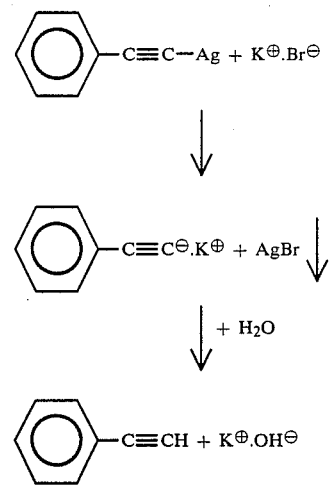

The base forming process of the present invention can be effectively applied to various chemical reaction systems requiring a base component, such as image formation in silver salt or diazotype photographic process, anionic polymerization of an adhesive, coating film formation, action of sealing or caulking agent, detergent, etc.

The acetylide anion or other bases formed in the present invention can be used as a catalyst for the polymerization reaction of anionic polymerizable monomers. There is no specific limitation with respect to the anionic polymerization employing the process of the invention. Therefore, the anionic polymerization can be applied to the various products, such as adhesives, coating agents, sealing or caulking materials.

The process of the present invention can be also applied to other products containing a base component, such as detergents, mold killers, etc. In these cases, the products preferably are in the form of a binary system consisting of one component containing the acetylide compound and the other containing the above-mentioned salt composed of an anion and a cation (hereinafter referred to as anionic compound). When both components are mixed together for the use of the product, an acetylide anion (strong base) or other base can be formed according to the invention. As a result, these products can be made neutral, safe and stable according to the present invention.

In the diazotype photographic process, the remaining diazonium salt within the unexposed area and a coupler are subjected to a coupling reaction to form an azo dye, as shown in the following reaction formula.

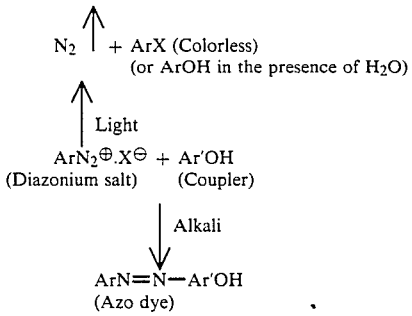

When the present invention is applied to the diazotype photographic process, for example, to the wet process employing one-component system, the anionic compound together with the diazonium salt is added to a diazotype light-sensitive paper and the acetylide compound together with the coupler is added to the developing solution. An alkaline developing solution has been used in a conventional wet diazotype photographic process. Where the present invention is applied to the process, a neutral developing solution can be used so that the process has an advantage of the safe and stable developing solution. Alternatively, the anionic compound may be added to the developing solution and the acetylide compound may be added to the light-sensitive paper. In this case, a similar effect can be also obtained.

In a conventional silver salt photographic process, the development (i.e., an oxidation-reduction reaction between silver halide and a developing agent) is carried out under an alkaline condition. Where the anionic compound is added to a light-sensitive material and an acetylide compound is added to a developing solution according to the invention, a neutral developing solution can be used. Therefore, the developing solution is remarkably improved in the stability and the handling. Alternatively, the anionic compound may be added to the developing agent and the acetylide compound may be added to the light-sensitive material. In this case, a similar effect can be also obtained.

The process of the present invention can be also applied to the light-sensitive material for heat development in the above-mentioned silver salt or diazotype photographic process. When the acetylide compound and the anionic compound are contained in the light-sensitive material, they are preferably arranged to be not in contact with each other. Therefore, each of them can be contained in different layers (a barrier layer may be provided between two layers), or one of them can be contained in capsules or in the form of fine particles to separate one from the other. Alternatively, the acetylide compound and the anionic compound can be contained in different materials. For example, the acetylide compound may be contained in a light-sensitive material and the anionic compound may be contained in a sheet material for development. In the development process, both of the materials can be arranged together in layers and then heated.

Further, the process of the present invention can be advantageously applied to the light-sensitive material comprising a light-sensitive layer containing silver halide, a reducing agent and a polymerizable compound provided on a support. This light-sensitive material can be used in an image forming method in which a latent image of silver halide is formed, and then the polymerizable compound is polymerized to form the corresponding image.

Examples of the image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Japanese Patent Provisional Publication No. 61(1986)-260241 (corresponding to U.S. Patent Ser. No. 854,640) describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

The polymerization reaction in the above-mentioned image-forming methods smoothly proceeds under an alkaline condition. Therefore, a base may be contained in the light-sensitive layer of the light-sensitive material prior to the heat development process. Examples of the base are described in Japanese Patent Provisional Publication No. 61(1986)-73145 (corresponding to U.S. Pat. No. 4,629,676 and European Patent Provisional Publication No. 0174634A2). Alternatively, in a wet development process described in Japanese Patent Publication Nos. 45(1970)-11149 (corresponding to U.S. Pat. No. 3,697,275), an alkaline developing solution was used.

The present inventors have found some problems in the case that the heat or wet development process is carried out under an alkaline condition.

Where a base is contaned in the light-sensitive layer prior to the heat development process, the base sometimes has a problem with respect to the stability and a tendency to accelerate decomposition of other components in the light-sensitive layer. Therefore, a light-sensitive material containing a base in the light-sensitive layer tends to lower in the sensitivity and the sharpness of the obtained image, while the material is preserved for a long term or under a severe condition. In order to increase the stability of the light-sensitive material, a base precursor can be used in place of the base. Examples of the base precursor which is thermally decomposed to release a base are described in Japanese Patent Provisional Publication No. 61(1986)-73145 (corresponding to U.S. Pat. No. 4,629,676 and European Patent Provisional Publication No. 0174634A2). The present inventors have found that these base precursors are incomplete with respect to the stability in the preservation or the rate of the decomposition (i.e., releasing a base) in the heat development process.

On the other hand, the alkaline developing solution used in the wet development process has a problem with respect to the stability of the reducing components contained in the solution. Further, the alkaline developing solution should be carefully handled, because the alkaline solution has a skin irritation.

The present invention provides a light-sensitive material which is improved in the preservability and gives a clear image in a heat development process.

The present invention also provides a light-sensitive material which gives a clear image in a wet development process utilizing a neutral developing solution.

The light-sensitive material to which the present invention is applied comprises a light-sensitive layer containing silver halide, a reducing agent and a polymerizable compound on a support, characterized in that the light-sensitive layer further contains an acetylide compound having the following formula:

$(R-C\equiv C-)_n M$ wherein
R is a monovalent group selected from the group consisting of an alkyl group, a cycloalkyl group, an alkenyl group, an alkynyl group, an aralkyl group, an aryl group and a heterocyclic group, each of which may have one or more substituent groups; M is an n-valent transition metal atom; and n is 1, 2 or 3;
and a salt composed of an anion having an affinity for the transition metal (M), said affinity of the anion for the transition metal being more than that of the acetylide anion (R—C≡C⁻), and a cation derived from one selected from the group consisting of an alkali metal, an alkaline earth metal, ammonia and an organic base.

The acetylide compound contained in the light-sensitive layer is substantially neutral and only slightly soluble in water, so that they are highly stable and have no influence on the stability of other components in the light-sensitive layer. When the light-sensitive material is heated or treated with a polar solvent, a base can be easily formed in the light-sensitive layer by the reaction of the acetylide compound with the above-mentioned salt (i.e., the anionic compound) according to the invention. Thus, a devepoment process of the light-sensitive material can be carried out under an alkaline condition.

Therefore, the light-sensitive material can give a clear image, even if the material is preserved for a long term or under a severe condition. Further, the formed acetylide anion in the heat development process is a remarkably strong base. Therefore, the light-sensitive material has a high sensitivity and can give a clear image, even if the heat development process is carried out at a low temperature or in a short time. Furthermore, the light-sensitive material can give a clear image in a wet development process and the development process advantageously can use a neutral developing solution.

In the light-sensitive material, the above-mentioned acetylide compounds can be used singly or in combination. The acetylide compound is preferably used in an amount of 3 to 50 weight % of the light-sensitive layer, and more preferably used in an amount of 5 to 30 weight %.

The above-mentioned salt (i.e., the anionic compound) preferably is used in an amount of 3 to 40 weight % of the light-sensitive layer, and more preferably used in an amount of 5 to 30 weight %.

Where the silver halide, the reducing agent and the polymerizable compound are contained in microcapsules which are dispersed in the light-sensitive layer, the acetylide compound and the anionic compound are preferably arranged outside of the microcapsules.

In the case that a heat development is utilized for developing the light-sensitive material, a hot-melt solvent is preferably contained in the light-sensitive layer. The hot-melt solvent preferably is a compound which is insoluble in water and has a polar group.

The hot-melt solvent has a function of accelerating the reaction of the acetylide compound with the anionic compound in the heat development process. Namely, when the light-sensitive material is heated, the acetylide compound is dissolved in the hot-melt solvent to accelerate the reaction. Further, the hot-melt solvent more preferably has a function as a solvent of the anionic compound to more accelerate the reaction.

The melting point of the hot-melt solvent preferably is in the range of 50° to 150° C., and more preferably in the range of 80° to 130° C.

The hot-melt solvent preferably is a compound selected from the group consisting of a carboxylic acid amide, a sulfonamide, a phosphoric acid amide, a ketone, an ester, an ether, urea, an urea derivative and an urethane.

Examples of the hot-melt solvent which are preferably used in the light-sensitive material are described hereinafter.

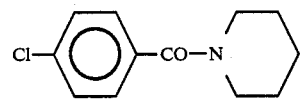 (TS-1)

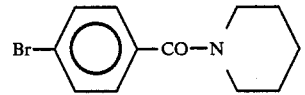 (TS-2)

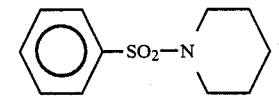 (TS-3)

-continued
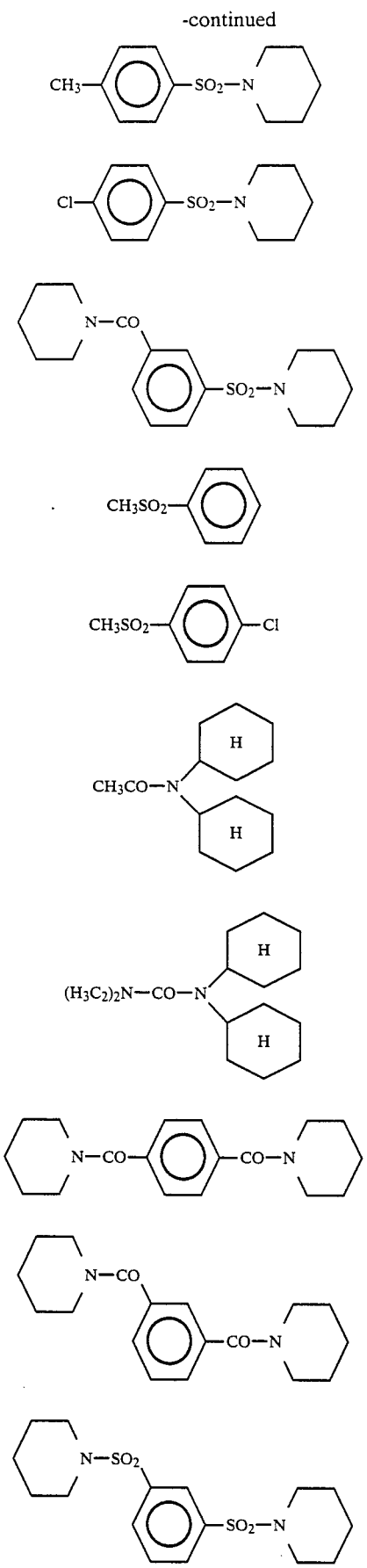
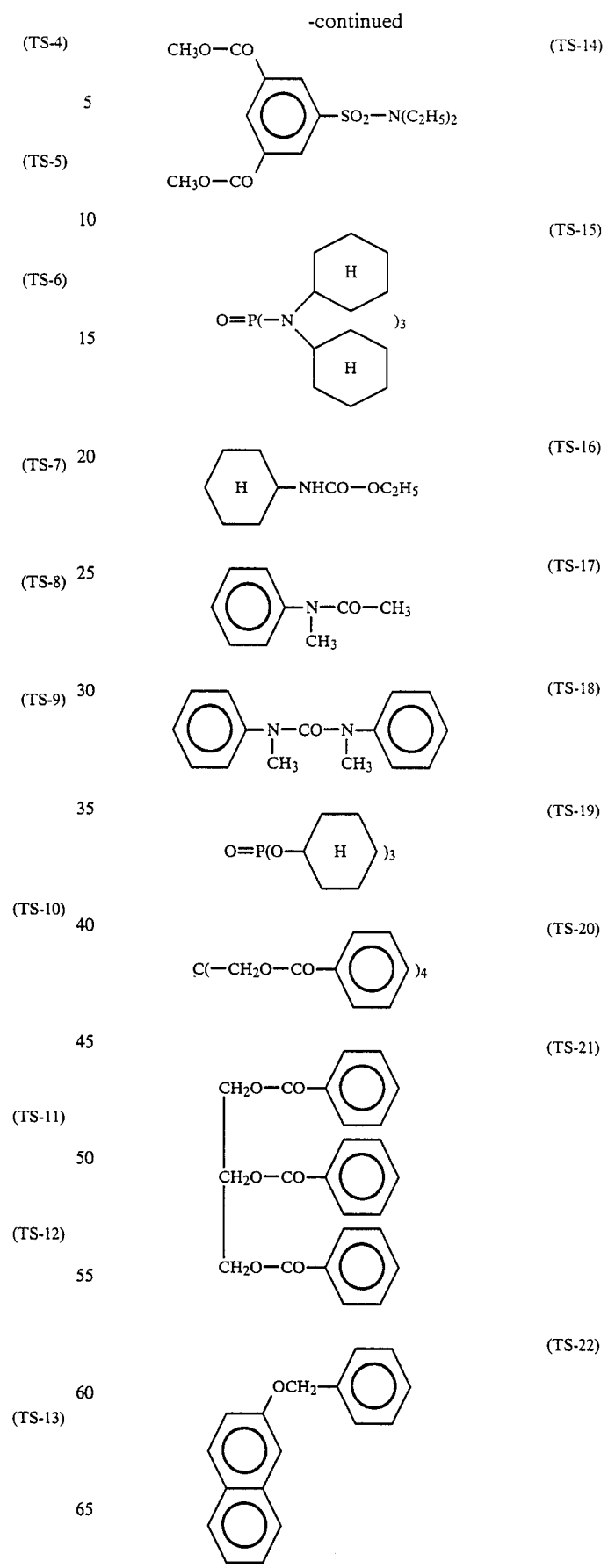

(TS-23) 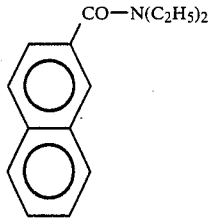

(TS-24) 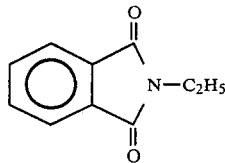

(TS-25) $H_2N-SO_2-N(C_3H_7)_2$ (TS-26) 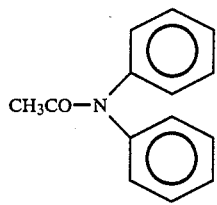

(TS-27) 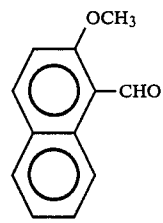

(TS-28) 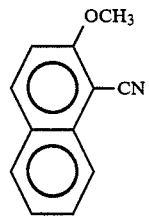

The hot-melt solvent is preferably used in an amount of 3 to 30 weight % of the light-sensitive layer, and more preferably used in amount of 5 to 20 weight %.

The hot-melt solvent preferably is in the form of fine particles which are dispersed in the light-sensitive layer. In this case, the acetylide compound is preferably contained in the particle of the hot-melt solvent. The light-sensitive material containing the acetylide compound in the particle is more improved in the preservability, because the acetylide compound is not in contact with the anionic compound.

The silver halide, the reducing agent, the polymerizable compound and the support which constitute the light-sensitive material are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be emplyed.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, 291-334 (1977), Research Disclosure No. 17029, 9-15 (June 1978), and Research Disclosure No. 17643, 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable componds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1\times10^4$ times as much as the silver halide.

The light-sensitive material can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent may be also contained in the oil droplets.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm. In the case that silver halide grains are contained in the microcapsule, the mean grain sized of the silver halide grains preferably is not more than the 5th part of the mean size of the microcapsules, more preferably is not more than the 10th part. It is observed that when the mean sized of the microcapsules is not less than 5 times as much as the mean grain size of silver halide grains, even and uniform image can be obtained.

In the case that silver halide grains are contained in the microcapsule, the silver halide grains are preferably arranged in the shell material of the microcapsules.

Further, two or more kinds of the microcapsules differing from each other with respect to at least one of the silver halide, the polymerizable compound and the color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiators and solvents of the polymerizable compound.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter - Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylene-tetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

In the case that the color image forming substance comprising two components (e.g., a color former and a developer), one component and the polymerizable compound are contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into oils, surface active agents, compounds functioning as an antifogging agent and/or a development accelerator, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

The photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer, a release layer, a cover sheet or a protective layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the triazene compound is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion. The other components can be added to the coating solution in a similar manner as the emulsion of the polymerizable compound.

There is no specific limitation with respect to the addition of the acetylide compound and the anionic compound in the preparation of the light-sensitive material. In the case that a hot-melt solvent is added to the light-sensitive layer, the acetylide compound and the hot-melt solvent are added to the coating solution preferably in the form of a dispersion of the mixture composed of them.

A light-sensitive material can be prepared by coating and drying the above-prepared coating solution on a support in the conventional manner.

Use of the light-sensitive material is described below.

In the use of the light-sensitive material, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The light-sensitive material can use a neutral developing solution according to the present invention.

The image forming method described in Japanese Patent Provisional Publication No. 61(1986)-69062 which employs a heat development process has an advantage of simple procedures and short processing time because of the dry process. Thus, this method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

In the above development process, a polymer image can be formed on the light-sensitive layer. A pigment iamge can be also obtained by fixing pigments to the polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the following light-sensitive material. In the case that a porous material, such as paper is used as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the case that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compound known in the art of the conventional photography according to the kind of the color image forming substance. If desired, the image-receiving layer can be composed of two or more layers containing two or more mordants different in the mordanting power form each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 $\mu$m, more preferably from 1 to 20 $\mu$m.

A protective layer can be provided on the surface of the image-receiving layer.

After the development process, pressing the light-sensitive material on the image-receiving material to transfer the unpolymerized polymerizable compound to the image-receiving material, a polymer iamge can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed area, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Aqueous Solution of Acetylide Compound

To an aqueous solution of the following acetylene compound (1.2 mol/l) was added an equivalent amount of silver nitrate. The formed nitric acid was neutralized with an aqueous solution of sodium hydroxide to adjust a pH of 6.6.

(Acetylene compound)

$H_5C_2O(C_2H_4O)_3CH_2-C\equiv CH$

In this way, an aqueous solution of the following acetylide compound (25) was obtained.

(Acetylide compound (25))

$H_5C_2O-C_2H_4O-C_2H_4O-C_2H_4O-CH_2-C\equiv C-Ag$

Effect on Addition of Potassium Halide

FIG. 1 is a line graph illustrating pH change in the above aqueous solution of the acetylide compound, when potassium halides are added to the solution.

In FIG. 1, the axis of abscissa represents the equivalent concentration of potassium halides added and the axis of ordinate represents the pH value of the solution. The curve (-□-□-) shows the case where potassium iodide is added, the curve (-Δ-Δ-) shows the case where potassium bromide is added, the curve (-O-O-) shows the case where potassium chloride is added, and the curve (-×-×-) shows the case where potassium fluoride is added.

FIG. 1 shows that the pH values are remarkably increased, when each of halide ions except fluorine ion is added.

It is apparent from the above results that chlorine ion, bromine ion and iodine ion have an affinity for silver, the affinity of these halide ions for silver is equal to or more than that of the acetylide anion. As a result, a base was formed by the addition of these anions.

EXAMPLE 2

Application to Alkylation Reaction of Phenol

In 200 ml of ethyl acetate were dissolved 20.9 g of the following acetylide compound (1), 32.2 g of tetrabutylammonium bromide and 9.4 g of phenol. To the solution was added 15.1 g of dimethyl sulfate, and the mixture was stirred at 50° C. for two hours.

(Acetylide compound (1))

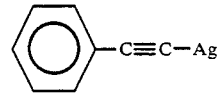

The precipitate was recovered by filtration and washed with water. The organic layer thereof was analyzed by means of gas chromatography and it was confirmed that anisole was formed in a yield of 90%. Thus, it was found that the base forming process of the present invention can be effectively applied to the alkylation of phenol.

EXAMPEL 3

Application to Diazotype Light-Sensitive Material

A diazonium salt composition composed of a mixture of the following components was coated on a base paper to give a layer having wet thickness of 100 μm.

| Diazonium salt composition | |
|---|---|
| 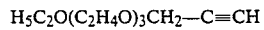 | 30 mg |
| Citric acid | 20 mg |
| Methylene blue | 0.1 mg |
| Potassium bromide | 200 mg |
| Water | 5 ml |

After drying the obtained light-sensitive material, the material was exposed to ultraviolet light a transparent text original in a conventional diazotype copying machine.

Further, the exposed material was treated with a developing solution having the following composition.

| Developing solution | |
|---|---|
| HO—⌬—SO₃Na | 1 g |
| (Acetylide compound (38))<br>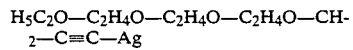 | 0.8 g |
| Borax | 0.5 g |
| Water | 20 ml |

As a result, a clear purple-colored positive image having an optical density of 1.25 was obtained.

EXAMPLE 4

Application to Chloroprene Adhesive

Immediately before use, 6 parts of the acetylide compound (1) used in Example 2 was mixed with a mixture consisting of 100 parts of chloroprene rubber, 4 parts of magnesium oxide, 5 parts of zinc oxide, 2 parts of an antioxidant, 20 parts of an alkylphenolic resin and 5 parts of tetrabutylammonium bromide dissolved in 400 parts of toluene. The resulting mixture was thin-coated on a side of two adherends (polyvinyl chloride sheets)

and in a half-dried state are bonded to each other under pressure.

Change in bond strength with the passage of time was examined. When a commercially available chloroprene adhesive was used, sufficient bond strength was still not obtained after 30 minutes, while when the adhesive having the above formulation was used, sufficient bond strength was obtained after 30 minutes.

As a result, it was apparent that initial bond strength was particularly improved, when the process for formation of an acetylide anion was applied the adhesive according to the present invention

EXAMPLE 5

Preparation of Silver Halide Emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of Silver Benzotriazole Emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of Light-Sensitive Composition

In 100 g of trimethylolpropane triacrylate were dissolved 0.40 g of the following copolymer, 5.0 g of the following leuco dye and 2 g of Emulex NP-8 (tradename of Nippon Emulsion Co., Ltd.).

(Copolymer)

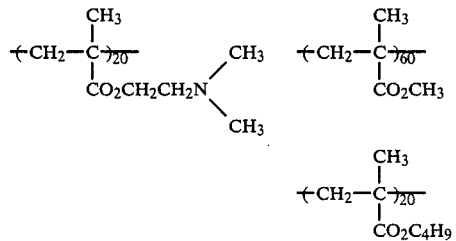

(Leuco dye)

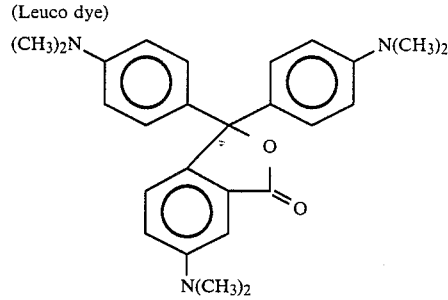

To 18.00 g of the resulting solution were added a solution in which 0.16 g of the following reducing agent (I) and 1.22 g of the following reducing agent (II) are dissolved in 1.80 g of methylene chloride.

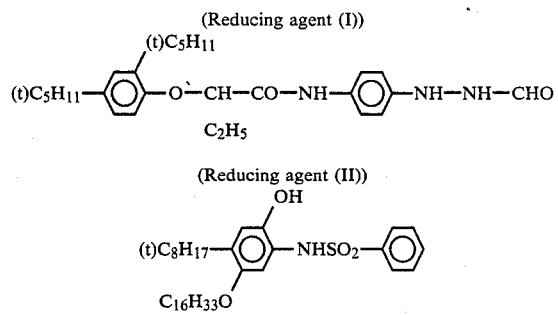

To the mixture were further added 3.50 g of the silver halide emulsion and 3.35 g of the silver benzotriazole emulsion, and the mixture was stirred at 15,000 r.p.m. for 5 minutes to obtain a light-sensitive composition.

Preparation of Light-Sensitive Microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of Dispersion of Mixture Composed of Acetylide Compound and Hot-Melt Solvent The mixture of 10 g of the acetylide compound (1) used in Example 2 and 15 f of the following hot-melt solvent was melted at 85° C. to make the mixture uniform.

(Hot-melt solvent)

-continued

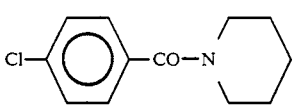

To the uniform mixture was added 2 g of 1% aqueous solution of the following anionic surfactant and 100 ml of 1% aqueous gelatin solution, and the resulting mixture was coarsely dispersed in a mixer. The mixture was further dispersed in Dynomill dispersing device for 10 minutes to obtain a dispersion of the mixture composed of an acetylide compound and a hot-melt solvent (Anionic surfactant)

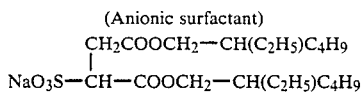

Preparation of Light-Sensitive Material

To 10.0 g of the light-sensitive microcapsule dispersion were added 1.0 g of 1% aqueous solution of the above anionic surfactant, 1.2 g of 10% aqueous solution of tetraethylammonium chrolide and 1.2 g of the dispersion of the mixture composed of an acetylide compound and a hot-melt solvent to prepare a coating solution.

The coating solution was uniformly coated on a polyethyleneterephthalate film (thickness: 100 μm) using a coating rod of #40 to give a layer having a wet thickness of 70 μm and dried at about 35° C. to obtain a light-sensitive material (A).

EXAMPLE 6

Preparation of Light-Sensitive Material

Each of the light-sensitive materials (B) to (E) was prepared in the same manner as in Example 5 except that 10 g of each of the following acetylide compounds (2), (3), (12) and (13) was respectively used in place of 10 g of the acetylide compound (1).

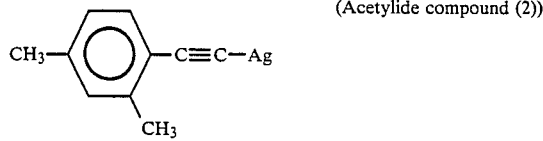
(Acetylide compound (2))

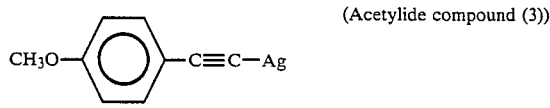
(Acetylide compound (3))

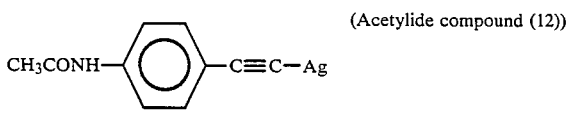
(Acetylide compound (12))

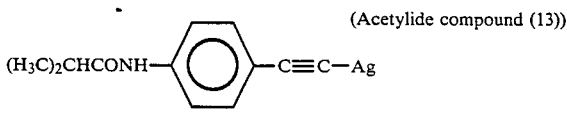
(Acetylide compound (13))

Preparation of Image-Receiving Material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on an art paper having a basis weight of 43 g/m² to give a layer having a wet thickness of 30 μm and dried to obtain an image-receiving material.

Evaluation of Light-Sensitive Material

Each of the light-sensitive materials prepared in Examples 5 and 6 was imagewise exposed to light using a tungsten lamp at 200 lux for 1 second and then heated on a hot plate at 125° C. for 30 seconds. Each of the exposed and heated light-sensitive materials was then combined with the image-receiving material and passed through press rolls under pressure of 350 kg/cm². The density of the positive color image obtained on the image-receiving material was measured using a reflection densitometer.

Alternatively, the light-sensitive materials were preserved at 50° C. for 5 days as a forced thermal test. Each of the light-sensitive materials was then evaluated as mentioned above.

The results are set forth in Table 1.

TABLE 1

| Light-Sensitive Material | Acetylide Compound | Immediately after Preparation | | after Thermal Test | |
|---|---|---|---|---|---|
| | | Maximum Density | Minimum Density | Maximum Density | Minimum Density |
| (A) | (1) | 1.42 | 0.25 | 1.35 | 0.28 |
| (B) | (2) | 1.38 | 0.22 | 1.34 | 0.25 |
| (C) | (3) | 1.30 | 0.20 | 1.40 | 0.28 |
| (D) | (12) | 1.48 | 0.35 | 1.44 | 0.36 |
| (E) | (13) | 1.44 | 0.30 | 1.35 | 0.30 |

It is apparent from the results in Table 1 that each of the light-sensitive materials forms an improved positive image which has a high maximum density and a low minimum density, even if the light-sensitive material was heated at a relatively low temperature (125° C.) in the development process. It is also apparent that each of the light-sensitive material has an improved preservability.

What is claimed is:

1. A process for formation of an acetylide anion of formula (R—C≡C⊖) as a base, which comprises reacting an acetylide compound having the following formula:

(R—C≡C⊖)$_n$M wherein R is a monovalent group selected from the group consisting of an alkyl group, a cycloalkyl group, an alkenyl group, an alkynyl group, an aralkyl group, an aryl group and a heterocyclic group, each of which may have one or more substituent groups; M is an n-valent transition metal atom; and n is 1, 2 or 3; with a salt composed of an anion having an affinity for the transition metal, said affinity of the anion for the transition metal being more than that of the acetylide anion corresponding to R—C≡C⊖, and a cation derived from one selected from the group consisting of an alkali metal, an alkaline earth metal, ammonia and an organic base.

2. The process as claimed in claim 1, wherein the anion of the salt is selected from the group consisting of chlorine ion, bromine ion and iodine ion.

3. The process as claimed in claim 1, wherein the cation of the salt is an alkali metal ion.

4. The process as claimed in claim 1, wherein the n in the formula is 1.

5. The process as claimed in claim 1, wherein the M in the formula is a monovalent metal atom selected from the group consisting of silver, copper and mercury.

6. The process as claimed in claim 1, wherein the R in the formula is an alkyl group or phenyl, each of which may have one or more substituent groups.

7. The process as claimed in claim 1, wherein the reaction is carried out in a polar solvent.

* * * * *